(12) United States Patent
Pizzi

(10) Patent No.: US 8,911,267 B2
(45) Date of Patent: Dec. 16, 2014

(54) CONTAINER FOR ELECTRICAL/ELECTRONIC CIRCUITS PROVIDED WITH SEATS AND ASSOCIATED CONTACT ELEMENTS FOR ELECTRICAL WIRING CONNECTORS

(71) Applicant: Morsettitalia S.p.A., Milan (IT)

(72) Inventor: Giordano Pizzi, Milan (IT)

(73) Assignee: Morsettitalia S.p.A., Milan (IT)

( * ) Notice: Subject to any disclaimer, the term of this patent is extended or adjusted under 35 U.S.C. 154(b) by 86 days.

(21) Appl. No.: 13/848,388

(22) Filed: Mar. 21, 2013

(65) Prior Publication Data
US 2013/0248244 A1 Sep. 26, 2013

(30) Foreign Application Priority Data
Mar. 23, 2012 (IT) .............................. MI2012A0457

(51) Int. Cl.
*H01R 9/26* (2006.01)
*H05K 7/14* (2006.01)
*H05K 5/00* (2006.01)

(52) U.S. Cl.
CPC ............ *H05K 5/0069* (2013.01); *H01R 9/2633* (2013.01); *H05K 7/1428* (2013.01)
USPC ........................................ 439/716; 439/76.1

(58) Field of Classification Search
CPC ...... H01R 9/26; H01R 9/2675; H01R 9/2625; H01R 9/2491; H01R 9/2658; H01R 13/113; H01R 13/20
USPC .......................................... 439/715–716, 76.1
See application file for complete search history.

(56) References Cited

U.S. PATENT DOCUMENTS

| 6,575,771 | B2 * | 6/2003 | Schnatwinkel et al. | 439/76.1 |
|---|---|---|---|---|
| 7,666,005 | B2 * | 2/2010 | Heggemann et al. | 439/76.1 |
| 7,775,806 | B2 * | 8/2010 | Heggemann et al. | 439/76.1 |
| 8,128,430 | B2 * | 3/2012 | Diessel | 439/507 |
| 8,647,157 | B2 * | 2/2014 | Gan et al. | 439/716 |

FOREIGN PATENT DOCUMENTS

| DE | 29713960 U1 | 12/1997 |
|---|---|---|
| DE | 202009002498 U1 | 7/2010 |
| EP | 1953869 A2 | 8/2008 |
| GB | 1266290 A | 3/1972 |

* cited by examiner

*Primary Examiner* — Xuong Chung Trans
(74) *Attorney, Agent, or Firm* — Mintz Levin Cohn Ferris Glovsky and Popeo, P.C.

(57) ABSTRACT

Container for electrical/electronic circuits, comprising an insulating body (110) having internally at least one central space (111) for receiving a printed circuit (2), and a side closing cover (3), at least one female seat (120) extending outwards in the longitudinal direction (X-X) in between the opposite top part and bottom part of the body (110), and a pin (201) which forms part of a conducting element (200) for electrically connecting together the connector (1) and the printed circuit (2) being arranged coaxially inside the said engaging seat (120), said pin (201) having a fold (201b) extending in the transverse direction (Y-Y) and integral with an edge (202b) of a first flat body (202) of the connector (200) parallel to the longitudinal direction (X-X).

15 Claims, 6 Drawing Sheets

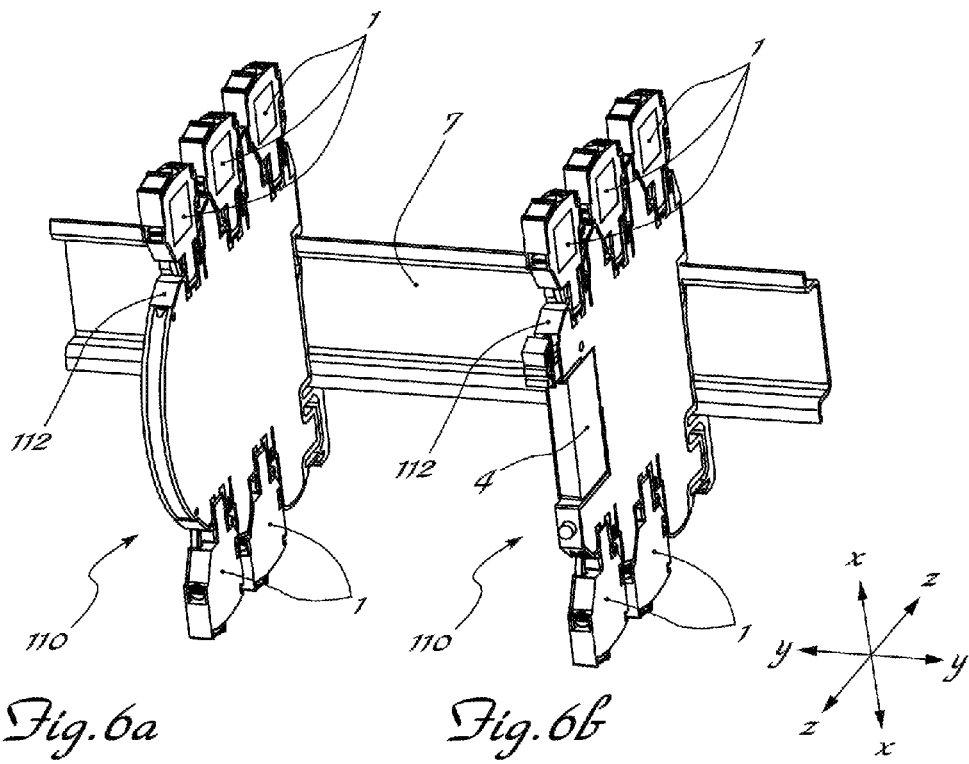
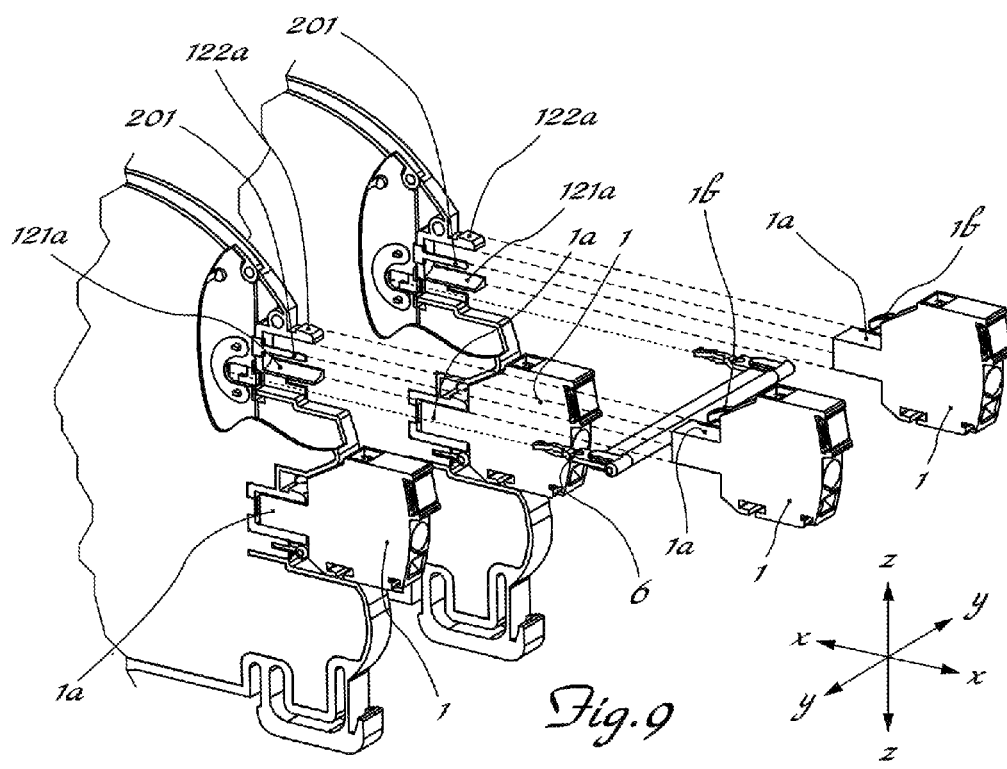

CONTAINER FOR ELECTRICAL/ELECTRONIC CIRCUITS PROVIDED WITH SEATS AND ASSOCIATED CONTACT ELEMENTS FOR ELECTRICAL WIRING CONNECTORS

RELATED APPLICATIONS

This application claims priority to Italian Patent Application No. MI2012A000457, filed on Mar. 23, 2012, the entire contents of which are hereby incorporated by reference.

TECHNICAL FIELD

The present invention relates to a container for electrical/electronic circuits, which is provided with seats and associated electrical connection elements for electrical wiring connectors.

BACKGROUND

It is known, in the technical sector relating to electrical connection devices such as terminal strips, connection boxes and the like, to use terminal blocks designed to be mounted on corresponding supports, such as DIN rails, and to provide access, in a top and bottom position, to the means for retaining the electrical connection wires which form the electric circuit and also provide an indication, on the front, of the connection function.

Although performing their function, these terminal blocks are however designed to provide an electrical connection between the opposite connections of the circuit by means of continuity jumpers which are situated inside the terminal block and nevertheless require internal screw-type or resilient spring means for retaining the connection wire.

Examples of such applications are the relay-holder containers or printed circuit containers which allow control of a greater number of circuits with smaller overall dimensions and easier implementation.

DE 297 13 960 U1 and DE 20 2009 002 498 U1 illustrate examples of containers for electric/electronic circuits according to the preamble of Claim 1. None of the containers according to the prior art is designed to provide a safe and reversible electrical connection, by means of external continuity jumpers, to further selected containers of an array of adjacent containers, in order to form multiple electrical connections.

DESCRIPTION

The technical problem which is posed, therefore, is that of providing a container, in particular for DIN rails, of connection boxes or switching panels forming part of wired circuits and the like, which is particularly simplified in terms of its internal components, even though designed to house both relays and printed circuit boards and form the required multiple electric circuit connections.

In connection with this problem it is also required that this container should have a small volume, be easy and inexpensive to produce and be able to be used equally with various types of known electrical containers.

These results are achieved according to the present invention by a container terminal block for connection circuits according to the characteristic features of Claim 1.

Figure 1:
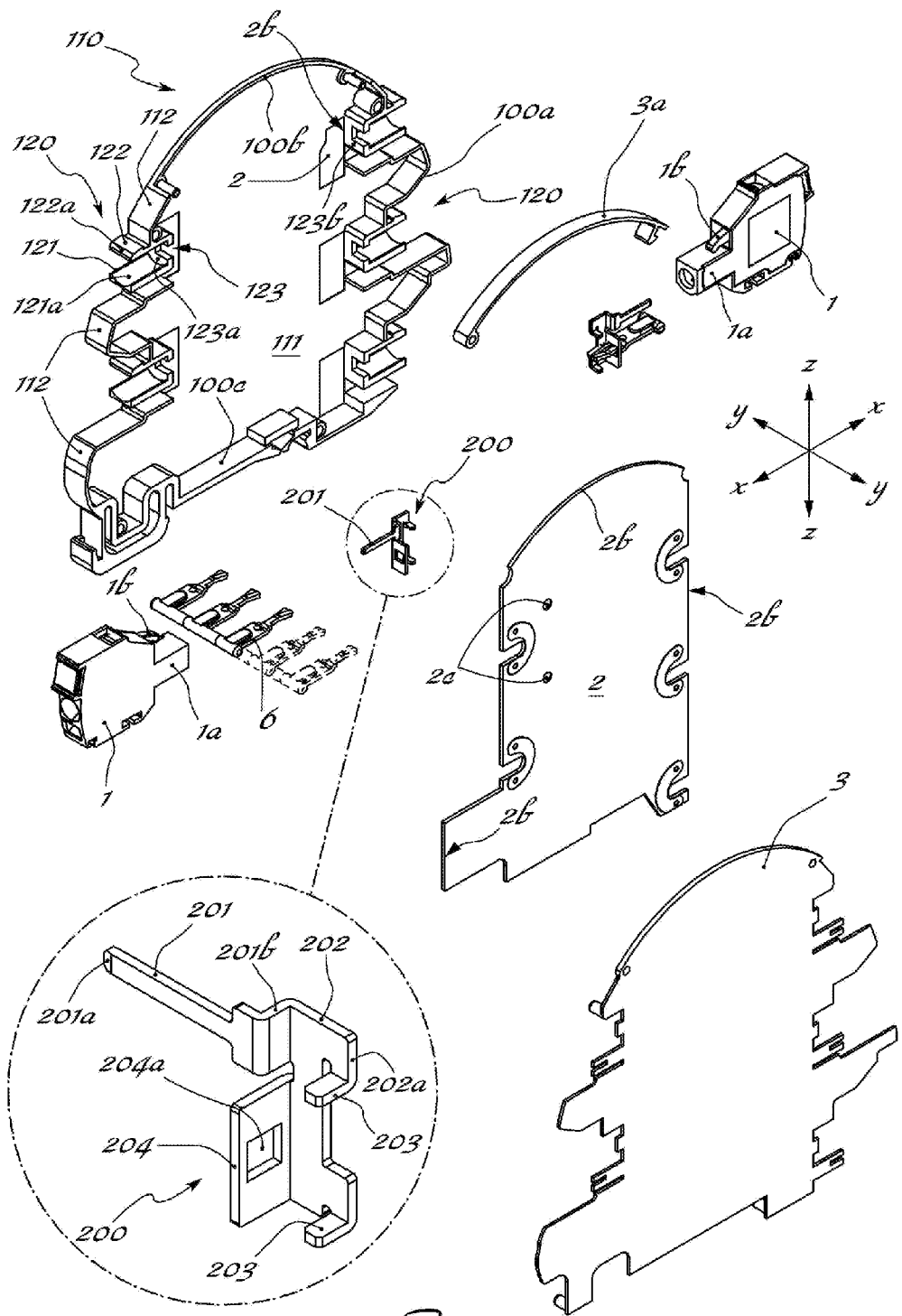
Figure 2:
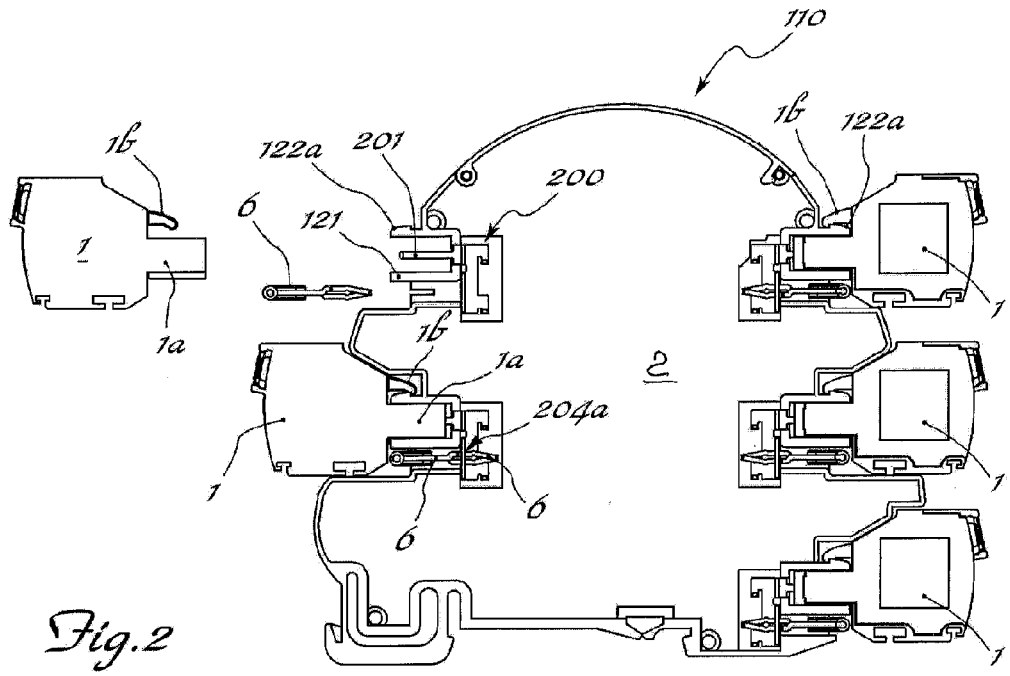
Figure 3:
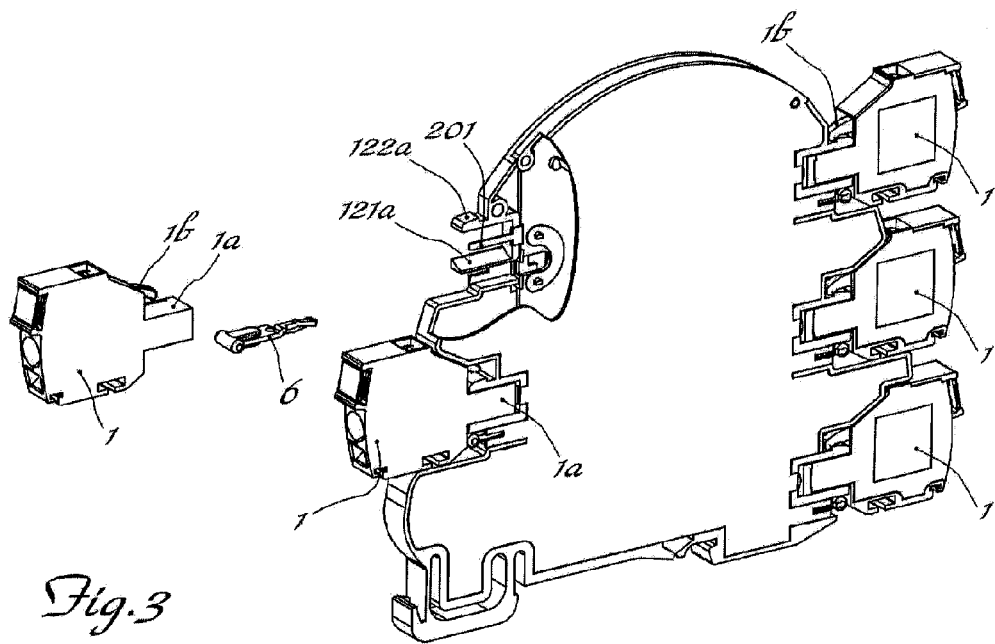
Figure 4:
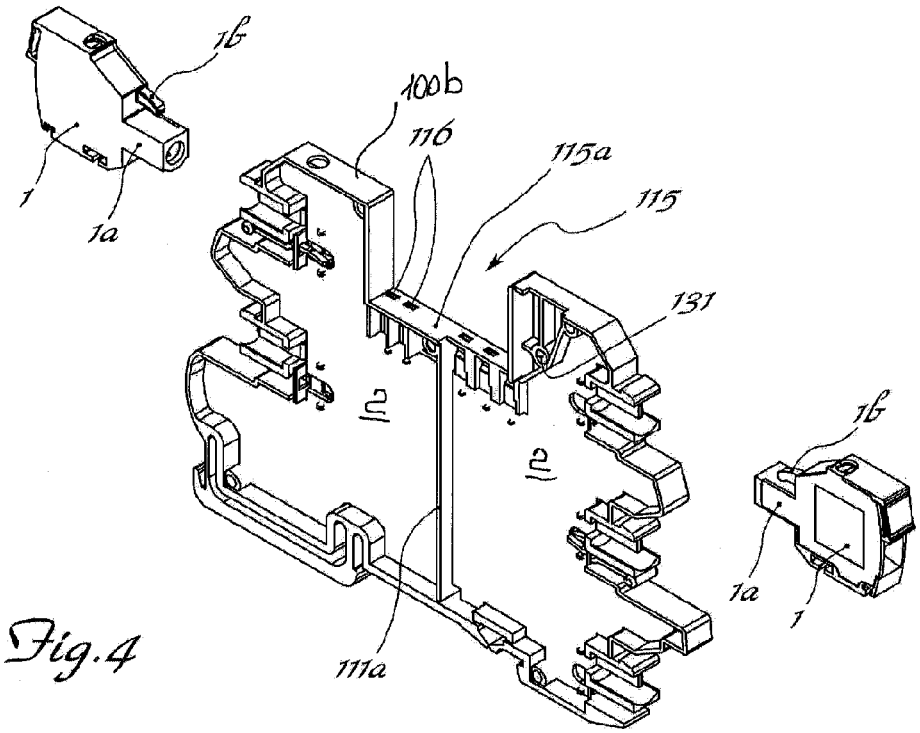
Figure 5:
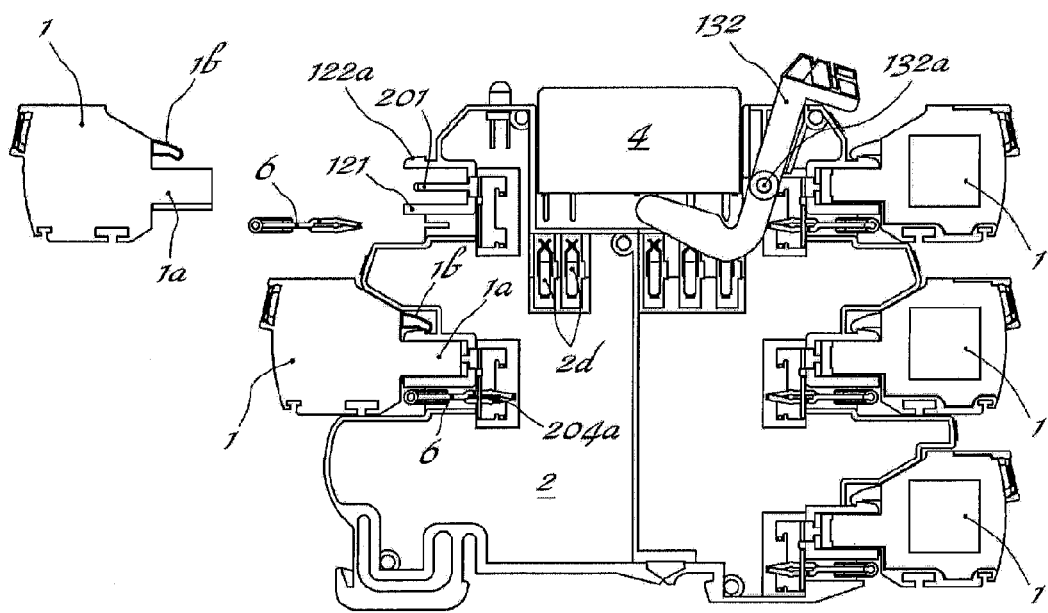
Figure 7A:
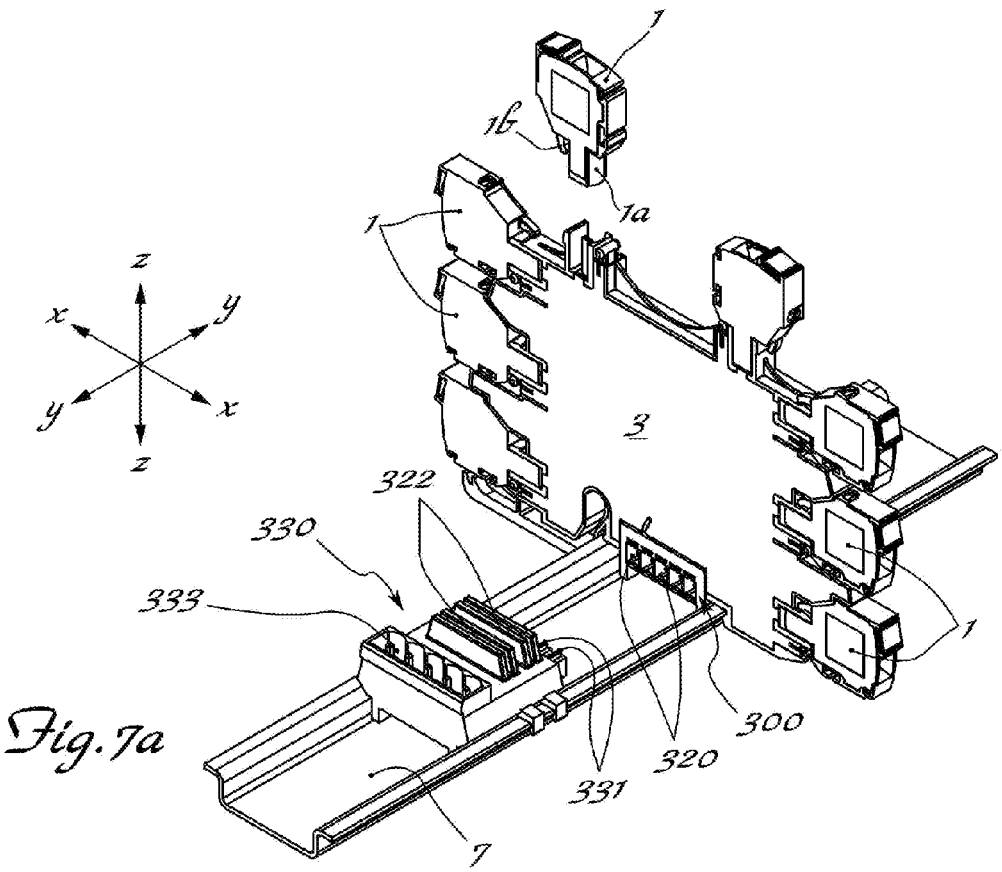
Figure 7B:
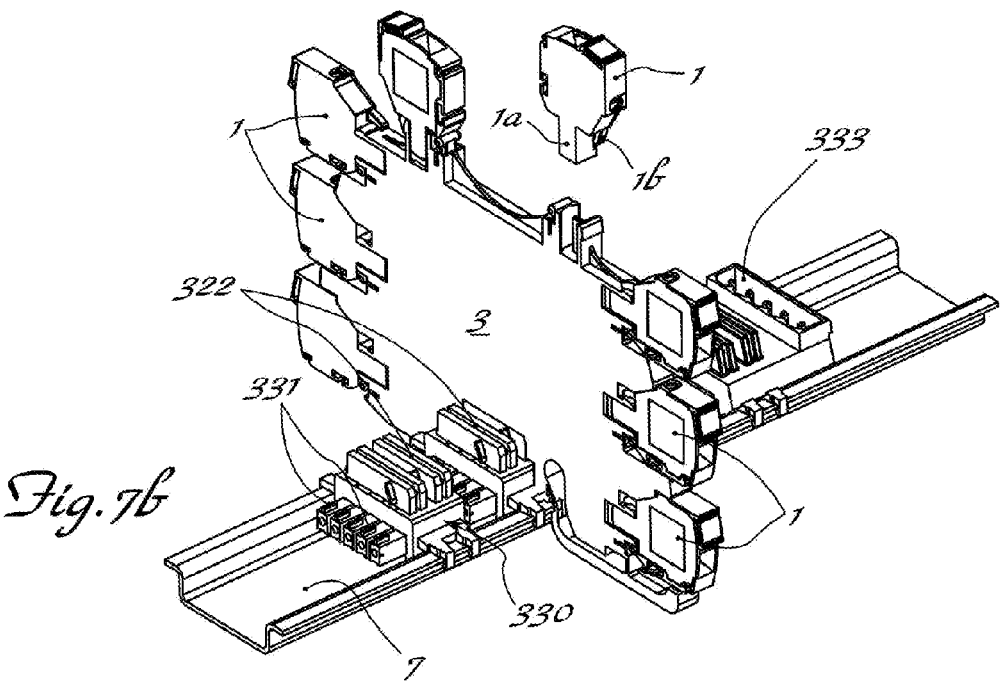
Figure 8:
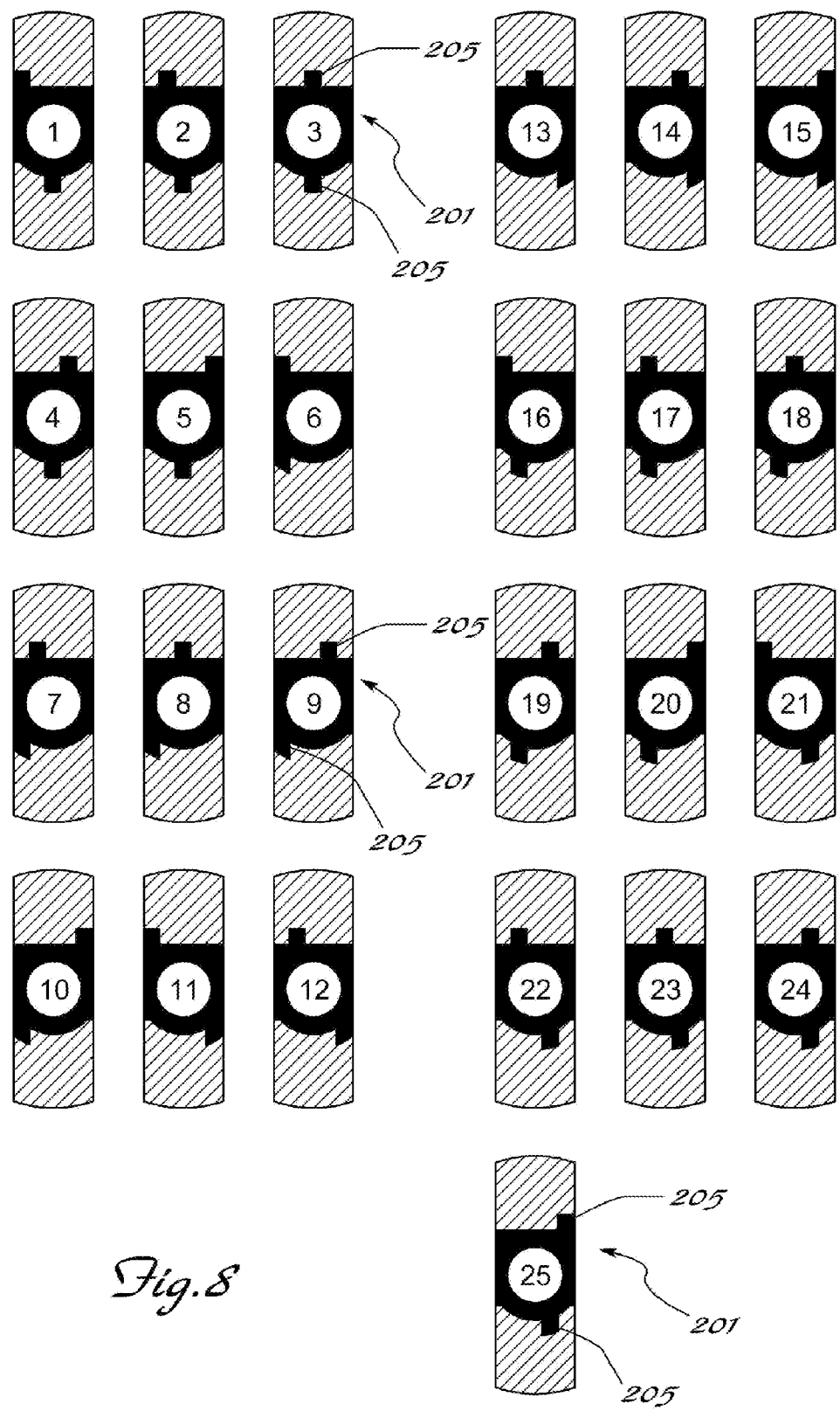

Further details may be obtained from the following description of a non-limiting example of embodiment of the subject of the present invention provided with reference to the accompanying drawings in which:

FIG. 1: shows an exploded view of a first embodiment of the container according to the present invention with associated printed circuit;

FIG. 2: shows a side view of the container according to FIG. 1 open in the partially assembled condition;

FIG. 3: shows a partially sectioned perspective side view of the container according to FIG. 1 closed with connectors inserted/extracted;

FIG. 4: shows a perspective side view of a second embodiment of the container according to the present invention with associated printed circuit;

FIG. 5: shows a side view of the container according to FIG. 4, open, with the relay inserted;

FIG. 6a,6b: show respective front views of the containers according to the present invention mounted on the DIN rail;

FIGS. 7a, 7b: show perspective views, from two opposite sides, respectively, of a further embodiment of the container according to the present invention;

FIG. 8: shows the coding diagram of the connector insertion seats for a corresponding biunique connection; and FIG. 9: shows a perspective view of several containers according to the invention arranged adjacent in a row and selectively connected by means of jumpers.

Assuming the following, solely for the sake of convenience of the description without any limiting meaning and in the operating position of the container shown in FIGS. 6a, 6b:

- a side part corresponding to the opening/assembly/closing side of the container;
- top/bottom parts corresponding to the part for joining the container to the external electrical wiring connectors;
- a front part for displaying information indicating the function of the connection; as well as
- a set of three reference axes respectively in a longitudinal direction X-X corresponding to the direction of extension of the seats for engagement with the connectors; transverse direction Y-Y corresponding to the direction of lateral opening/assembly/closing of the container; and vertical direction Z-Z at right angles to the plane containing the other two directions, the container according to the present invention comprises essentially:
- an insulating body 110 having internally at least one central space 111—two in the example of FIG. 4—for receiving one or more printed circuits 2 which have a matching (male/female) perimetral profile 2b in relation to the internal profile of the walls 100a of the insulating body 110;

in the case of FIG. 4 the central space 111 is divided into two adjacent half-spaces by means of a partition 111a which separates two volumes for receiving two separate printed circuits 2 and/or devices with a different power supply voltage.

At least one female seat 120 extending outwards in the longitudinal direction X-X and suitable for receiving a corresponding external connector 1 is formed in between the top part/bottom part of the body 110.

Said female seats 120 are defined by a first tongue 121 extending in the longitudinal direction X-X, with a concave internal surface 121a corresponding to the form of the male element 1a of the connector 1, and by a second tongue 122 which is situated opposite the first tongue and the surface of which situated outside the container 110 in the longitudinal direction X-X and the seat 120 in the vertical direction Z-Z has a tooth 122a suitable for engagement with a corresponding hook 1b of the connector 1 for stably retaining the connector and preventing extraction thereof in the longitudinal direction X-X.

The end wall of the seat 120 inside the container 110 is in the form of an inversely arranged C 123 so as to form a first end-of-travel surface 123*a* for the male element 1*a* of the connector 1 and, on the opposite side to the end-of-travel surface 123, and therefore inside the container 110, a second contact surface 123*b* for the printed circuit 2, as will emerge more clearly below.

Frontally of each female seat 120, in the vertical direction Z-Z, the visible part of the container 110 has a respective display surface 112 bearing a label or the like for indicating the function of the connection between the respective female seat 120 and the associated connector 1.

According to a preferred embodiment said surfaces 112 lie along circumferential sections with different centre angles (FIG. 2) so as to allow reading of the function information displayed for all the female seats 120 which are available also when the connectors 1 are all inserted inside the respective seat.

As shown, said seats 120 for receiving the connector 1 are arranged symmetrically, although not always in an equal number, with respect to a central axis parallel to the vertical direction Z-Z.

A pin 201 extending in the longitudinal direction X-X and forming part of a conducting element 200 for electrically connecting together the connector 1 and the printed circuit 2 is inserted inside each female seat 120.

On the opposite side to the free end 201*a* for engagement with the connector 1, the pin 201 has a fold 201*b* extending in the transverse direction Y-Y and integral with a first flat body 202 parallel to the longitudinal direction X-X; the edge 202*a* of the flat body 202 opposite to the pin 201 has, projecting therefrom, two teeth 203 at right angles to the said surface and extending in the transverse direction Y-Y for engagement with corresponding metallized holes 2*c* of the printed circuit 2 with which they determine the desired electrical connection.

The edge 202*b* of the surface 202 opposite to that of the teeth 203 has, integral therewith, a second surface 204, at right angles to the first surface, extending in the transverse direction Y-Y and provided with an opening 204*a* for engagement with jumpers 6 for electrically connecting together containers selected from among an array of adjacent containers (FIG. 9).

When the container is assembled, the second surface 204 comes into contact against the internal contact surface 123*b* of the seat 120.

The container is completed by a cover 3 which can be fitted to the side part of the body 110; if required by the form of the insulating body, a hinged front flap 3*a* is also provided, said flap being arranged between the body 110 and the said cover 3 so as to allow inspection and checks inside the container and restore closure thereof.

FIG. 4 shows an embodiment of the container according to the invention where the front surface 100*b* of the body 110 has a recess 115 for receiving a relay 4 (FIG. 5); in this case the bottom surface 115*a* of the recess 115 is provided with openings 116 for receiving the pins of the relay 4 which engage with corresponding electrical contact elements 2*d* of the printed circuit 2.

The internal side wall of the body 110 is also provided with a hole 131 having a transverse axis Y-Y for receiving a pivot 132*a* for rotation of a conventional lever 132 for extraction of the said relay 4.

In the example shown in FIG. 5 three electrical contacts for switching between the relay 4 and associated connectors 1 and, on the opposite side, two electrical power supply contacts are provided.

As can be seen, the interaxial distances in the vertical direction Z-Z of the engaging seats 120 and the openings for insertion of the jumpers 6 for electrically connecting together adjacent containers are such that each jumper is covered by the associated connector 1 when the latter is inserted inside its seat 120 (FIG. 2); this means that the connector 1 must be extracted before the jumper 6 can be fitted/extracted, this operation therefore being performed without the presence of electric power and therefore in safe conditions for the user.

As shown in FIG. 8, it is also possible to ensure a biunique connection between each connector 1 and each seat 120 by means of suitable coding formed by teeth 205 projecting from the electrical contact pin 201 and corresponding seats (not shown) inside the male element 1*a* of the connector 1; in this way each connector may be inserted only inside a corresponding seat, thus preventing connectors from being interchanged and therefore the risk of electrical connection errors.

Depending on the number of teeth used for coding, it is possible to obtain a number of coded connections which satisfy the specific requirements; in the example shown in FIG. 8 a top tooth and a bottom tooth have been used, resulting in a total of twenty five biuniquely coded connections.

According to the invention it is also envisaged (FIGS. 7*a*,7*b*) that the body 110 has in its surface 100*c* for engagement with the DIN rail 7 a further electrical contact element 300 with engaging seats 320 open in the transverse direction Y-Y and suitable for the insertion of connectors 331 of bases 330 slidable on the rail 7 and provided with further seats 322 for receiving printed circuits or sockets 333 for external connectors (not shown), this allowing expansion of the electrical connections and therefore the increased possibility of logic checks and connection to interfaces and the like for the same container dimensions.

It is therefore clear how the container according to the invention offers numerous advantages including:
- simplification of the internal components with elimination of the screw-type or spring means for mechanical retention of the connection wires with a consequent reduction in the assembly times and costs;
- speed and precision of the electrical connection owing to the special configuration of the seat/pin/connector;
- safety and precision, over time, of the connector connection, even following numerous insertion/extraction operations, due to the interaction in the longitudinal direction X-X between the second surface 204 of the conductor 200 and the surface 123*b* of the seat 120 inside the body 110, during extraction of the connector, said interaction preventing transmission, to the connections with the printed circuit, of stresses could give rise to defects in the electrical connections;
- connection of two separate and independent printed circuit boards;
- possibility of connecting several containers chosen from an array of adjacent containers, using jumpers 6, resulting in a safe and reversible connection.

It is also clear how, owing to the particular form of the conducting element, it is possible to reduce the number of parts to be manufactured and stocked since the same part may be used to connect the connectors and jumpers, ensuring correct positioning of the body.

In addition, it is envisaged that the seat 120 may be configured depending on different types of small/large/square/rectangular connectors 1 and that the pins 201 of the conducting elements 200 may be designed for different types of connector without adversely affecting the operating characteristics of the assembly; likewise the seat 204 may be provided with a different configuration depending on the different forms of the known jumpers.

Although described in connection with certain constructional forms and certain preferred examples of embodiment of the invention, it is understood that the scope of protection of the present patent is defined solely by the following claims.

What is claimed is:

1. A container for electrical/electronic circuits, comprising an insulating body (110) having internally at least one central space (111) for receiving a printed circuit (2), and a side closing cover (3), at least one female seat (120) extending outwards in the longitudinal direction (X-X) in between an opposite top part and a bottom part of the body (110), and a pin (201) which forms part of a conducting element (200) for electrically connecting together a connector (1) and the printed circuit (2) being arranged coaxially inside the female seat (120), said pin (201) having a fold (201b) extending in a transverse direction (Y-Y) and integral with an edge (202b) of a first flat body (202) of the connecting element (200) parallel to a longitudinal direction (X-X), wherein a second surface (204) is integral with said edge (202b) of the surface (202), at right angles thereto, extending in the transverse direction (Y-Y) and having an opening (204a) for engagement with jumpers (6) for electrically connecting together containers adjacent in the transverse direction (Y-Y).

2. The container according to claim 1, wherein said female seats (120) are defined by a first tongue (121) extending in the longitudinal direction (X-X) and by a second tongue (122) situated opposite the first tongue in a vertical direction (Z-Z).

3. The container according to claim 2, wherein an inner surface (121a) of the first tongue has a concave form corresponding to a form of a male element (1a) of the connector (1).

4. The container according to claim 2, wherein a surface of the first tongue (122) outside the container (110) in the longitudinal direction (X-X) and the female seats (120) in the vertical direction (Z-Z) has a tooth (122a) suitable for engagement with a corresponding hook element (1b) of the connector (1).

5. The container according to claim 2, wherein an end wall of the seat (120) inside the container (110) is in a form of an inversely arranged C (123) so as to form a first end-of-travel surface (123a) for a male element (1a) of the connector (1) and, on an opposite side inside the container (110), a second contact surface (123b) for the printed circuit (2).

6. The container according to claim 1, wherein above each female seat (120) in a vertical direction (Z-Z), a front part of the container (110) has a respective surface (112) for indicating a function of the connection between the respective female seat (120) and the associated connector (1).

7. The container according to claim 6, wherein said indicating surfaces (112) lie along circumferential sections with different centre angles.

8. The container according to claim 1, wherein an edge (202a) of the flat body (202) opposite to the pin (201) has two teeth (203) projecting at right angles to the said surface and extending in the transverse direction (Y-Y) for engagement with corresponding metallized holes (2c) in the printed circuit (2).

9. The container according to claim 1, wherein an interaxial distances in a vertical direction (Z-Z) of the female seats (120) and openings for insertion of the jumpers (6) for electrical connection of adjacent containers are such that each jumper is covered by the associated connector (1) when the latter is inserted inside its seat (120).

10. The container according to claim 1, wherein a front surface (100b) of the body (110) has a recess (115) for receiving a relay (4), a bottom surface (115a) of the recess (115) being provided with openings (116) for receiving pins of the relay (4).

11. The container according to claim 1, wherein inner side wall of the body (110) has a hole (131) with a transverse axis (Y-Y) for receiving a pivot (132a) for rotation of a lever (132) for extracting a relay (4).

12. The container according to claim 1, wherein the container has means for engagement with a DIN mounting rail (7).

13. The container according to claim 12, wherein the body (110) has in a surface (100c) for engagement with a rail (7) a further electrical contact element (300) with engaging seats (320) which are open in the transverse direction (Y-Y) and suitable for insertion of connectors (331) of bases (330) sliding on the rail (7) and having further seats (322) for receiving printed circuits or sockets (333) for external connectors.

14. The container according to claim 1, wherein each seat (120) has coding teeth (205) projecting from the pin (201) in a vertical direction (Z-Z) for biunique engagement with corresponding seats inside the male element (1a) of the connector (1).

15. The container according to claim 1, wherein the container further comprises a front flap (3a) hinged to open and close rotationally and arranged between the body (110) and a side closing cover (3).

* * * * *